US012676584B2

(12) United States Patent
Kawata

(10) Patent No.: US 12,676,584 B2
(45) Date of Patent: Jul. 7, 2026

(54) VARIABLE REACTANCE CIRCUIT AND IMPEDANCE MATCHING DEVICE PROVIDED WITH SUCH CIRCUIT

(71) Applicant: Adtec Plasma Technology Co., Ltd., Hiroshima (JP)

(72) Inventor: Etsuro Kawata, Hiroshima (JP)

(73) Assignee: Adtec Plasma Technology Co., Ltd., Hiroshima (JP)

( * ) Notice: Subject to any disclaimer, the term of this patent is extended or adjusted under 35 U.S.C. 154(b) by 54 days.

(21) Appl. No.: 18/495,649

(22) Filed: Oct. 26, 2023

(65) Prior Publication Data

US 2024/0380375 A1 Nov. 14, 2024

(30) Foreign Application Priority Data

May 10, 2023 (JP) ................................. 2023-077933

(51) Int. Cl.
*H03H 7/38* (2006.01)
*H01P 5/18* (2006.01)

(52) U.S. Cl.
CPC ............... *H03H 7/38* (2013.01); *H01P 5/184* (2013.01)

(58) Field of Classification Search
CPC .......... H01P 5/185; H01P 5/187; H01P 5/184; H01P 5/18; H01P 5/183; H01P 5/186; H01P 1/18; H01P 1/184; H01P 1/183
USPC ........................................................ 333/33
See application file for complete search history.

(56) References Cited

U.S. PATENT DOCUMENTS

| | | | | |
|---|---|---|---|---|
| 5,363,071 A | * | 11/1994 | Schwent | .................... H01P 5/04 |
| | | | | 333/17.1 |
| 10,727,028 B2 | | 7/2020 | Torii | |
| 2011/0057746 A1* | | 3/2011 | Yamamoto | ................ H01P 5/18 |
| | | | | 333/116 |
| 2015/0349735 A1* | | 12/2015 | Reuven | ..................... H01P 3/06 |
| | | | | 333/117 |
| 2023/0216467 A1 | | 7/2023 | Nordmann | |

FOREIGN PATENT DOCUMENTS

| | | |
|---|---|---|
| JP | H4112525 U | 9/1992 |
| JP | 6574737 B | 9/2019 |
| KR | 20230020540 A | 2/2023 |
| KR | 20230027881 A | 2/2023 |

* cited by examiner

*Primary Examiner* — Stephen E. Jones
(74) *Attorney, Agent, or Firm* — Hodgson Russ LLP

(57) ABSTRACT

An impedance matching device comprises a variable reactance circuit. The variable reactance circuit comprises a loosely coupled line portion 4 which includes a first line 2 and a second line 3 loosely coupled to the first line. One end 3*a* of the second line is connected to ground 5. The variable reactance circuit further comprises a capacity variable portion 6 provided between the other end 3*b* of the second line and ground. The capacity variable portion comprises a diode 7 connected between the other end of the second line and ground, a capacitor 8 connected in series to the diode between the other end of the second line and the diode, a variable DC power supply 11 connected between ground and a connection point 9 between the capacitor and the diode so as to apply reverse bias voltage to the diode, and a resistor 10 connected in series to the variable DC power supply between the connection point and ground.

12 Claims, 5 Drawing Sheets

[Fig. 1]
(A)
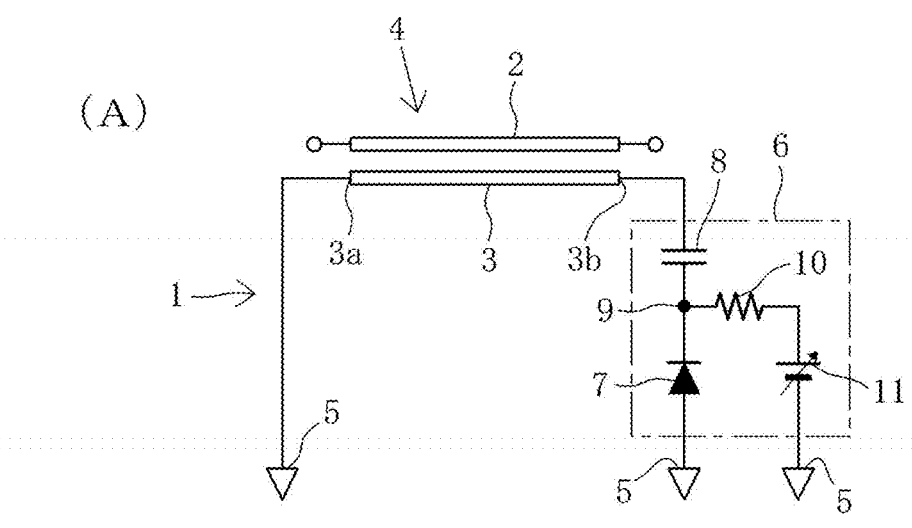
(B)
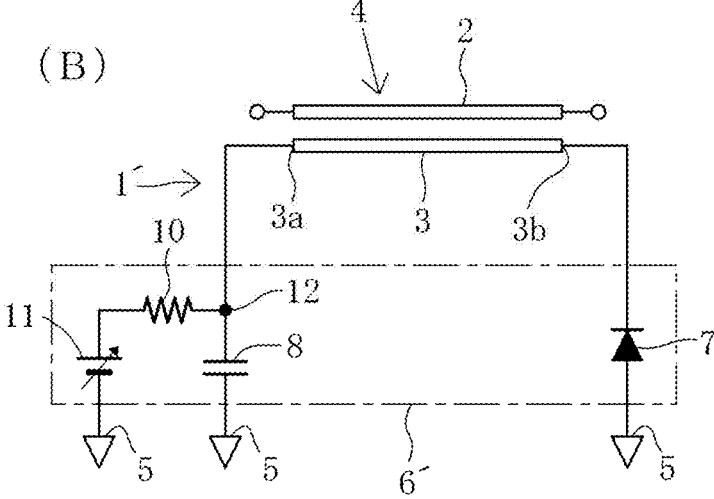

[Fig. 2]
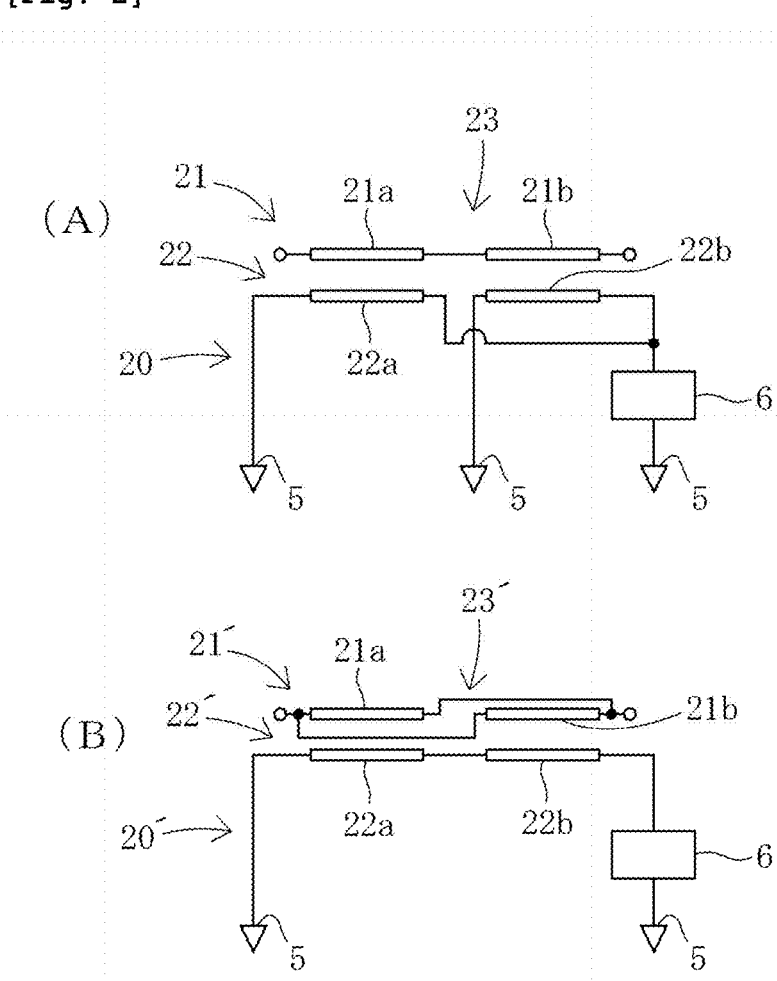

[Fig. 3]
(A)
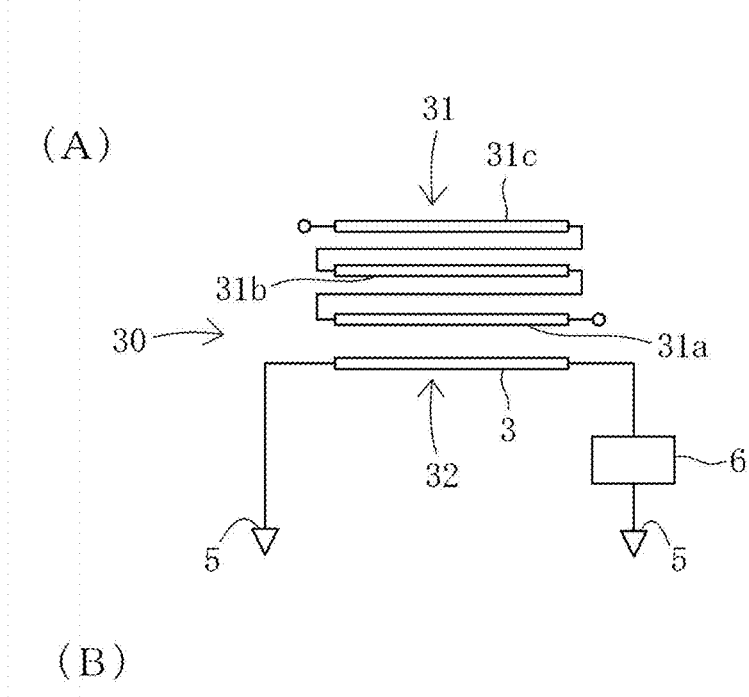
(B)
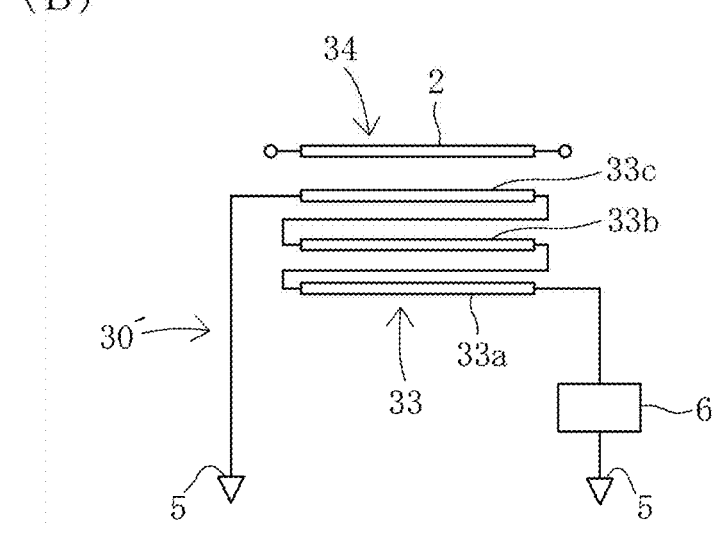

[Fig. 4]
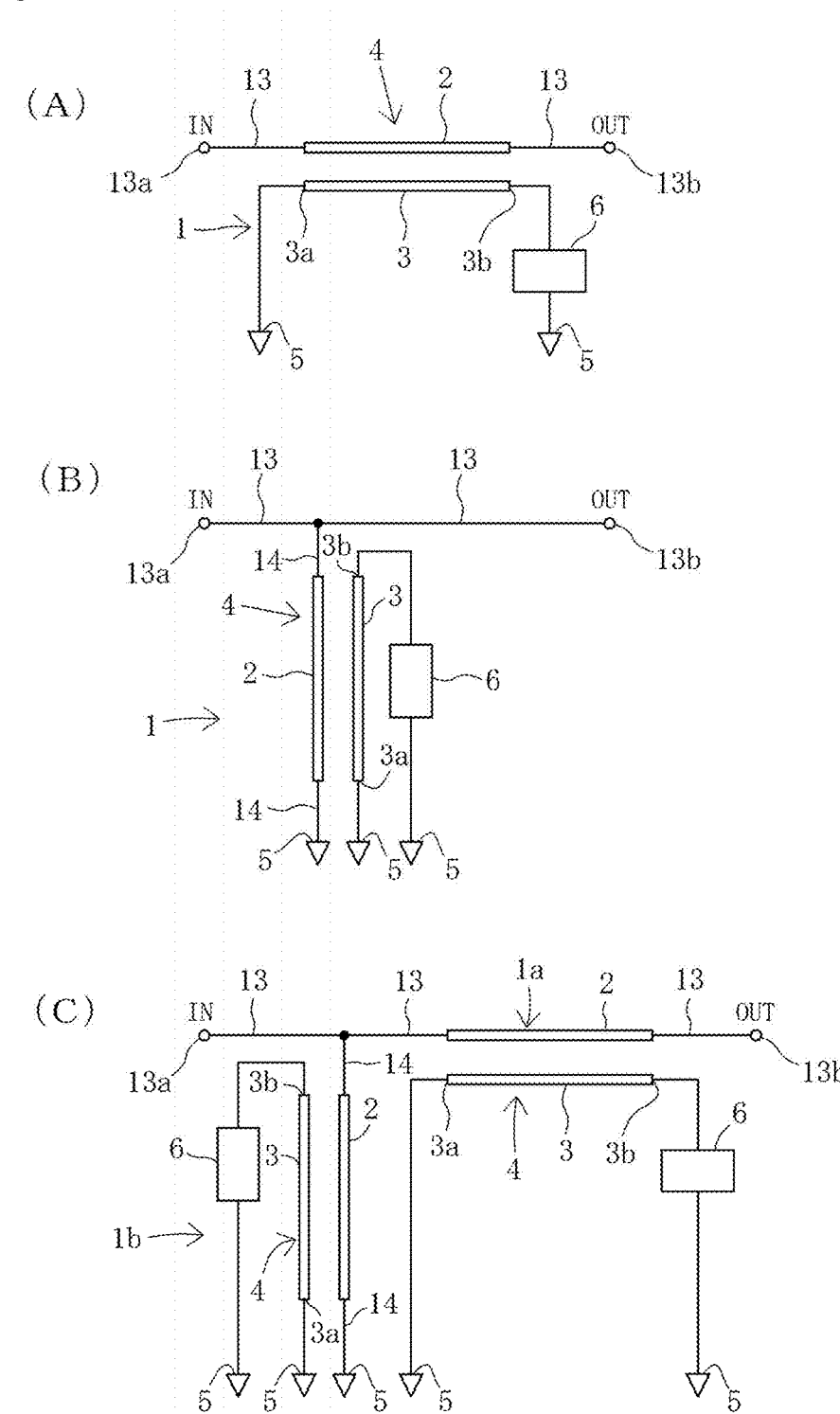

[Fig. 5]
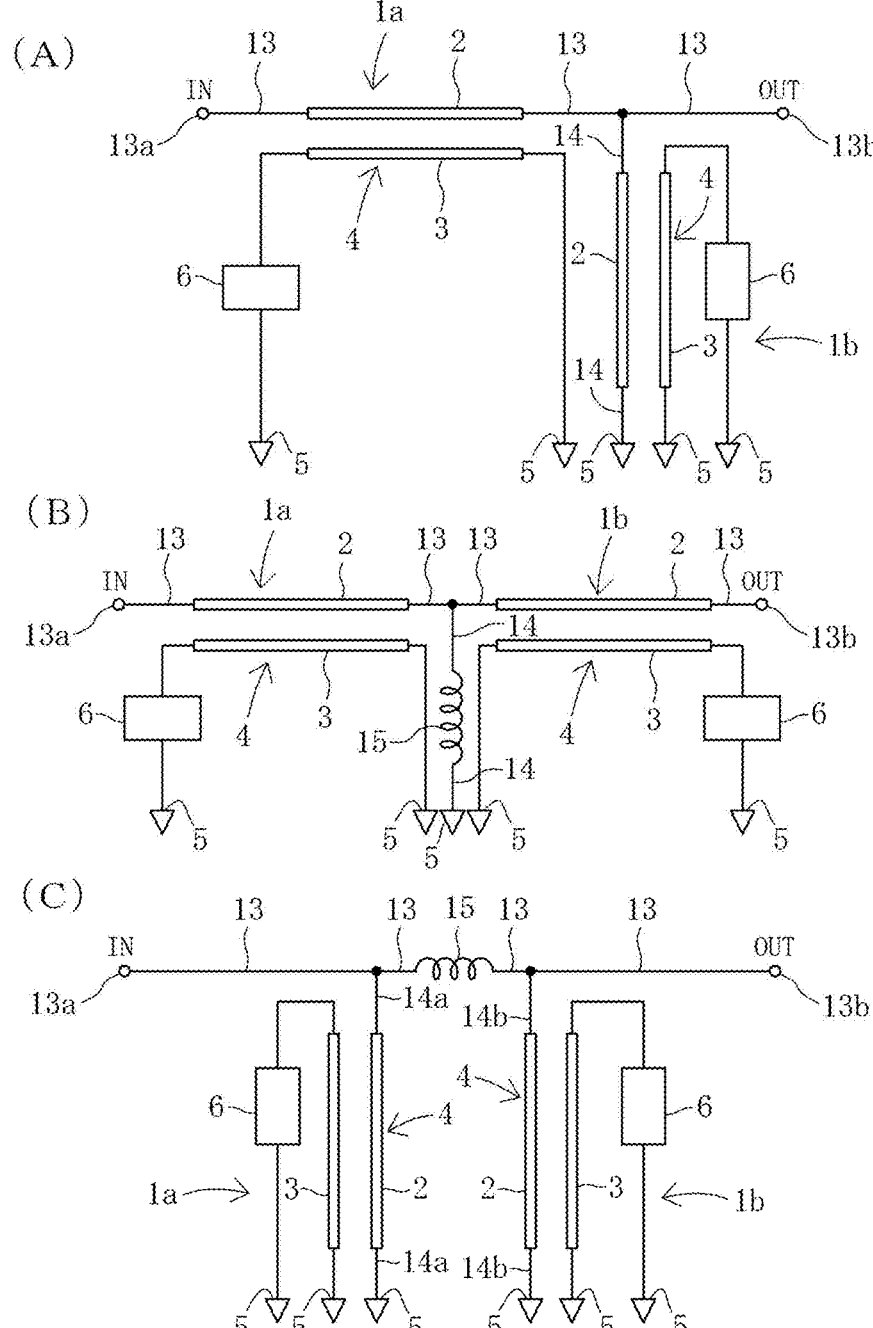

**VARIABLE REACTANCE CIRCUIT AND
IMPEDANCE MATCHING DEVICE
PROVIDED WITH SUCH CIRCUIT**

TECHNICAL FIELD

The present invention relates to a variable reactance circuit, especially, a circuit capable of changing both inductive reactance and capacitive reactance, and an impedance matching device provided with such circuit.

BACKGROUND ART

Between a high frequency power supply and a plasma load (a plasma processing apparatus), an impedance matching device is arranged.

A common impedance matching device includes one or more variable capacitors whose capacitance can be changed mechanically.

However, because this kind of variable capacitors are rotary variable capacitors whose capacitance can be changed depending on distance and area, the capacitor operating time depends on rotation speed. Consequently, the rotary variable capacitors are not suitable for high-speed operation.

Thus, an impedance matching device using a variable capacitor cannot achieve high-speed matching operation.

Therefore, in the prior art, an impedance matching device comprising one or more (variable capacitance) diodes instead of a variable capacitor is known. According to this kind of impedance matching devices, the capacitance can be electrically changed at high speed by changing reverse bias voltage applied to the diode, so that high-speed matching operation is achieved (see, for example, Patent Document 1).

However, according to this configuration, the diode is serially inserted into each of a transmission line and one or more branch lines branching from the transmission line, and, to a cathode of the diode, not only DC high voltage as revered bias voltage is applied from a variable DC power supply, but high frequency and high voltage from the transmission line is superimposed.

Further, between the variable DC power supply and the diode, a resistor is inserted so as to prevent high frequency components from flowing into the variable DC power supply.

In addition, a resistor is also inserted between the diode and ground because a DC feedback circuit is required for applying reverse bias voltage to the diode.

In this case, as the high frequency voltage increases, the voltage applied to the resistor between the variable DC power supply and the diode increase so that the resistor generates heat. When the applied voltage exceeds the rated voltage of the resistor, the resistor is destroyed or burns out.

To prevent this, in each of the transmission line and the branch line, a plurality of the diodes is arranged in multiple stages (a plurality of the diodes is connected in series) in a manner such that the voltage is divided for each of the diodes.

However, according to this configuration, there was a problem that the circuit became complicated and the impedance matching device became larger.

PRIOR ART DOCUMENTS

Patent Documents

Patent Document 1: JP 6574737 B

SUMMARY OF THE INVENTION

Problems to be Solved by the Invention

It is, therefore, an object of the present invention to provide a compact impedance matching device capable of high voltage energization and high-speed impedance matching.

Means for Solving the Problems

In order to achieve the object, the present invention provides a variable reactance circuit comprising: a loosely coupled line portion which includes a first line and a second line loosely coupled to the first line, the second line being connected to ground at one end thereof; and a capacity variable portion provided between the second line of the loosely coupled line portion and ground.

Here, "the second line is loosely coupled to the first line" means that the second line is coupled to the first line with a coupling constant within the range of 0.5 to 0.95 (the same applies hereinafter).

According to a preferred embodiment of the present invention, the first line of the loosely coupled line portion comprises a plurality of first line elements which are connected in series, and the second line of the loosely coupled line portion comprises a plurality of second line elements which are connected in parallel, and the second line elements are arranged opposite the first line elements, respectively.

According to another preferred embodiment of the present invention, the first line of the loosely coupled line portion comprises a plurality of first line elements which are connected in parallel, and the second line of the loosely coupled line portion comprises a plurality of second line elements which are connected in series, and the second line elements are arranged opposite the first line elements, respectively.

According to further preferred embodiment of the present invention, the second line of the loosely coupled line portion comprises a plurality of second line elements which are connected in series and arranged opposite the first line.

According to further preferred embodiment of the present invention, the first line of the loosely coupled line portion comprises a plurality of first line elements which are connected in series and arranged opposite the second line.

According to further preferred embodiment of the present invention, the capacity variable portion comprises a diode connected between the other end of the second line of the loosely coupled line portion and ground, a capacitor connected in series to the diode between the other end of the second line and the diode, a variable DC power supply connected between ground and a connection point between the capacitor and the diode so as to apply reverse bias voltage to the diode, and a resistor or a coil connected in series to the variable DC power supply between the connection point and ground.

According to further preferred embodiment of the present invention, the capacity variable portion comprises a diode connected between the other end of the second line of the loosely coupled line portion and ground, a capacitor connected between the one end of the second line and ground, a variable DC power supply connected between ground and a connection point between the one end of the second line and the capacitor so as to apply reverse bias voltage to the diode, and a resistor or a coil connected in series to the variable DC power supply between the connection point and ground.

In order to achieve the object, the present invention also provides an impedance matching device comprising: a transmission line provided with an input terminal and an output terminal; and the above-mentioned variable reactance circuit, the variable reactance circuit being provided in the transmission line, the first line of the loosely coupled line portion of the variable reactance circuit being serially inserted into the transmission line.

According to a preferred embodiment of the present invention, the impedance matching device further comprises: a branch line branching from between the variable reactance circuit and the input terminal or the output terminal in the transmission line and connected to ground; and another said variable reactance circuit provided in the branch line, the first line of the loosely coupled line portion of said another variable reactance circuit being serially inserted into the branch line.

According to another preferred embodiment of the present invention, the impedance matching device further comprises: another said variable reactance circuit provided between the variable reactance circuit and the input terminal or the output terminal in the transmission line, the first line of the loosely coupled line portion of said another variable reactance circuit being serially inserted into the transmission line; and a coil connected between ground and a connection point between the variable reactance circuits.

In order to achieve the object, the present invention also provides an impedance matching device comprising: a transmission line provided with an input terminal and an output terminal: a branch line branching from the transmission line and connected to ground; and the above-mentioned variable reactance circuit, the first line of the loosely coupled line portion of the variable reactance circuit being serially inserted into the branch line.

According to a preferred embodiment of the present invention, the impedance matching device further comprises: another branch line branching between the branch line and the input terminal or the output terminal in the transmission line and connected to ground; a coil inserted in series between the branch lines in the transmission line; and another said variable reactance circuit provided in said another branch line, the first line of the loosely coupled line portion of said another variable reactance circuit being serially inserted into said another branch line.

Effect of the Invention

According to the present invention, when a configuration that can electrically change capacitance, for example, a combination of the diode and the variable DC power supply for applying reverse bias voltage to the diode is adopted as the capacity variable portion, while high frequency is energized to the first line of the loosely coupled line portion, the reverse bias voltage for the diode is changed by the variable DC Power supply and thereby capacitance of the diode is changed rapidly, and with this change of the diode capacitance, reactance of the loosely coupled line portion (that is, the variable reactance circuit) is changed at high speed.

Furthermore, because the diode and the variable DC power supply for applying reverse bias voltage to the diode are used in combination with the loosely coupled line portion, the diode and the variable DC power supply can be operated with a ground reference. Accordingly, a resistor as an AC component block filter only has to be provided and no additional resistor needs to be provided between the diode and ground. Thereby a circuit around the diode can be made more compact than before.

In addition, when the first line of the loosely coupled line portion comprises a plurality of first line elements which are connected in series, and the second line of the loosely coupled line portion comprises a plurality of second line elements which are connected in parallel, and the second line elements are arranged opposite the first line elements, respectively, or when the first line of the loosely coupled line portion comprises a plurality of first line elements which are connected in parallel, and the second line of the loosely coupled line portion comprises a plurality of second line elements which are connected in series, and the second line elements are arranged opposite the first line elements, respectively, or when the second line of the loosely coupled line portion comprises a plurality of second line elements which are connected in series and arranged opposite the first line, or when the first line of the loosely coupled line portion comprises a plurality of first line elements which are connected in series and arranged opposite the second line, even if high voltage and high frequency is applied to the first line, the voltage or current supplied to the second line can be suppressed by dividing the voltage or dividing the current in the loosely coupled line portion, and thereby it is possible to avoid arranging the diodes in multi stages and complicating a circuit around the diode and increasing the size of the circuit.

BRIEF DESCRIPTION OF THE DRAWINGS

FIGS. 1(A) and 1(B) are circuit diagrams of variable reactance circuits according to embodiments of the present invention.

FIGS. 2(A) and 2(B) are circuit diagrams of variable reactance circuits according to embodiments of the present invention.

FIGS. 3(A) and 3(B) are circuit diagrams of variable reactance circuits according to embodiments of the present invention.

FIG. 4(A) through 4(C) are circuit diagrams of some examples of impedance matching devices comprising one or more variable reactance circuits shown in FIG. 1(A).

FIG. 5(A) through 5(C) are circuit diagrams of some examples of impedance matching devices comprising one or more variable reactance circuits shown in FIG. 1(A).

BEST MODE FOR CARRYING OUT THE INVENTION

Preferred embodiments of the present invention will be explained below with reference to accompanying drawings.

FIG. 1(A) is a circuit diagram of a variable reactance circuit according to an embodiment of the present invention.

Referring to FIG. 1(A), a variable reactance circuit 1 of the present invention comprises a loosely coupled line portion 4 which includes a first line 2 and a second line 3 loosely coupled to the first line 2. The second line 3 of the loosely coupled line portion 4 is connected to ground 5 at one end 3a thereof.

Here, "the second line 3 is loosely coupled to the first line 2" means that the second line 3 is coupled to the first line 2 with a coupling constant within the range of 0.5 to 0.95 (the same applies hereinafter).

The variable reactance circuit 1 further comprises a capacity variable portion 6 provided between the second line 3 of the loosely coupled line portion 4 and ground 5.

In this embodiment, the capacity variable portion 6 comprises a diode 7 connected between the other end 3b of the second line 3 of the loosely coupled line portion 4 and ground 5, a capacitor 8 connected in series to the diode 7 between the other end 3b of the second line 3 and the diode 7, a variable DC power supply 11 connected between ground 5 and a connection point 9 between the capacitor 8 and the diode 7 so as to apply reverse bias voltage to the diode 7, and a resistor 10 connected in series to the variable DC power supply 11 between the connection point 9 and ground 5.

In this case, an anode of the diode 7 is connected to ground 5 and a cathode of the diode 7 is connected to the other end 3b of the second line 3 through the capacitor 8.

The capacitor 8 acts as a filter for blocking a direct current.

Further, a negative electrode of the variable DC power supply 11 is connected to ground 5 and a positive electrode of the variable DC power supply 11 is connected to the cathode of the diode 7 through the resistor 10.

The resistor 10 acts as a filter for blocking AC component.

In the variable reactance circuit 1 of the present invention, while high frequency is energized to the first line 2 of the loosely coupled line portion 4, the reverse bias voltage for the diode 7 is changed by the variable DC Power supply 11 and thereby capacitance of the diode 7 is changed rapidly, and with this change of the diode capacitance, reactance of the loosely coupled line portion 4 (that is, the variable reactance circuit 1) is changed at high speed.

Furthermore, because the diode 7 and the variable DC power supply 11 for applying reverse bias voltage to the diode 7 are used in combination with the loosely coupled line portion 4, the diode 7 and the variable DC power supply 11 can be operated with a ground reference. Accordingly, a resistor 10 as an AC component block filter only has to be provided and no additional resistor needs to be provided between the diode 7 and ground 5. Thereby a circuit around the diode 7 can be made more compact than before.

Although the resistor 10 is used as an AC component block filter in this embodiment, a coil may be used instead of the resistor 10.

FIG. 1(B) is a circuit diagram of a variable reactance circuit according to another embodiment of the present invention.

The embodiment shown in FIG. 1(B) is different from the embodiment shown in FIG. 1(A) only in the configuration of the capacity variable portion. Therefore, in FIG. 1(B), the same elements as shown in FIG. 1(A) are identified with the same reference numerals as used in FIG. 1(A), and the detailed explanation thereof will be omitted in what follows.

In this embodiment, the diode 7 and other components (the capacitor 8, the resistor 10 and the variable DC power supply 11) are separated into the other end 3b and one end 3a of the second line 3 of the loosely coupled line portion 4, respectively.

That is to say, as shown in FIG. 1(B), a capacity variable portion 6' of a variable reactance circuit 1' comprises the diode 7 connected between the other end 3b of the second line 3 of the loosely coupled line portion 4 and ground 5, a capacitor 8 connected between one end 3a of the second line 3 and ground 5, the variable DC power supply 11 connected between ground 5 and a connection point 12 between one end 3a of the second line 3 and the capacitor 8 so as to supply reverse bias voltage to the diode 7, and the resistor

10 serially connected to the variable DC power supply 11 between the connection point 12 and ground 5.

In this case, the anode of the diode 7 is connected to ground 5 and the cathode of the diode 7 is connected to the other end 3b of the second line 3.

Further, the second line 3 is connected to ground 5 at one end 3a thereof through the capacitor 8, the negative electrode of the variable DC power supply 11 is connected to ground 5, and the positive electrode of the variable DC power supply 11 is connected to one end 3a of the second line 3 through the resistor 10.

The capacitor 8 acts as a filter for blocking direct current and the resistor 10 acts as a filter for blocking DC component.

This embodiment also provides the same effects as the embodiment shown in FIG. 1(A). In addition, in this embodiment, when the capacitor 8 has relatively large capacity, high frequency components no longer exist at the connection point 12, that is, high frequency is no longer applied to the resistor 10.

Consequently, it is only necessary to provide a resistor with significantly smaller size (with low resistance value) than the size required by design, so that the variable reactance circuit 1 can be made more compact.

Similar to the embodiment shown in FIG. 1(A), a coil may be used instead of the resistor 10 in this embodiment.

FIGS. 2(A) and 2(B) are circuit diagrams of variable reactance circuits according to further embodiments of the present invention.

Each of the embodiments shown in FIGS. 2(A) and 2(B) is different from the embodiment shown in FIG. 1(A) only in the configuration of the loosely coupled line portion. Therefore, in FIGS. 2(A) and 2(B), the same elements as shown in FIG. 1(A) are identified with the same reference numerals as used in FIG. 1(A), and the detailed explanation thereof will be omitted in what follows and further, the circuit of the capacity variable portion is not shown and is drawn as a single box.

Referring to FIG. 2(A), in this embodiment, a first line 21 of a loosely coupled line portion 23 of a variable reactance circuit 20 comprises two first line elements 21a and 21b which are connected in series and arranged on a straight line, and a second line 22 of the loosely coupled line portion 23 comprises two second line elements 22a and 22b which are connected in parallel and arranged on a straight line.

The two second line elements 22a and 22b are arranged opposite the two first line elements 21a and 21b, respectively. One end of the second line 22 is connected directly to ground 5, and the other end of the second line 22 is connected to ground 5 through the capacity variable portion 6.

According to this embodiment, the voltage applied to the capacity variable portion 6 can be halved. Therefore, this embodiment is particularly effective when a relatively high voltage is applied to both ends of the first line 21.

Referring to FIG. 2(B), in this embodiment, a first line 21' of a loosely coupled line portion 23' of a variable reactance circuit 20' comprises two first line elements 21a and 21b which are connected in parallel and arrange on a straight line, and a second line 22' of the loosely coupled line portion 23' comprises two second line elements 22a and 22b which are connected in series and arranged on a straight line.

The two second line elements 22a and 22b are arranged opposite the two first line elements 21a and 21b, respectively. One end of the second line 22' is connected directly to ground 5, and the other end of the second line 22' is connected to ground 5 through the capacity variable portion 6.

According to this embodiment, the current flowing into the capacity variable portion 6 can be halved. Therefore, this embodiment is particularly effective when a relatively large current flows into the first line 21'.

In the embodiments shown in FIGS. 2(A) and 2(B), the number of the first and second line elements is not limited to two, and more than three first line elements and more than three second line elements may be provided in so far as there are the same number of the first and second line elements.

FIGS. 3(A) and 3(B) are circuit diagrams of variable reactance circuits according to further embodiments of the present invention.

Each of the embodiments shown in FIGS. 3(A) and 3(B) is different from the embodiment shown in FIG. 1(A) only in the configuration of the loosely coupled line portion. Therefore, in FIGS. 3(A) and 3(B), the same elements as shown in FIG. 1(A) are identified with the same reference numerals as used in FIG. 1(A), and the detailed explanation thereof will be omitted in what follows and further, the circuit of the capacity variable portion is not shown and is drawn as a single box.

Referring to FIG. 3(A), in this embodiment, a first line 31 of a loosely coupled line portion 32 of a variable reactance circuit 30 comprises three first line elements 31*a*-31*c* which are connected in series and arranged opposite the second line 3.

According to this embodiment, the voltage applied to the first line 31 is divided to each of the first line elements 31*a*-31*c* depending on the ratio (3:1) of the length of the first line 31 and the second line 3 of the loosely coupled line portion 32 and thereby, only voltage for one line element 31*a*-31*c* is applied to the second line 3.

That is to say, the voltage applied to the capacity variable portion 6 can be reduced by dividing the voltage within the loosely coupled line portion 32.

Referring to FIG. 3(B), in this embodiment, a second line 33 of a loosely coupled line portion 34 of a variable reactance circuit 30' comprises three second line elements 33*a*-33*c* which are connected in series and arranged opposite the first line 2. One end of the second line 33 is connected directly to ground 5 and the other end of the second line 33 is connected to ground 5 through the capacity variable portion 6.

According to this embodiment, current excited in the second line 33 is distributed to each of the second line elements 33*a*-33*c* depending on the ratio (1:3) of the length of the first line 2 and the second line 33 of the loosely coupled line portion 34 and thereby, only ⅓ of the current of the first line 2 flows into the capacity variable portion 6.

That is to say, the current flowing into the capacity variable portion 6 can be reduced by dividing the current in the loosely coupled line portion 34.

FIGS. 4(A) through 4(C) and FIGS. 5(A) through 5(C) are circuit diagrams of some examples of an impedance matching device provided with the variable reactance circuit shown in FIG. 1(A). In FIGS. 4(A) through 4(C) and FIGS. 5(A) through 5(C), the same elements as shown in FIG. 1(A) are identified with the same reference numerals as used in FIG. 1(A), and the detailed explanation thereof will be omitted in what follows and further, the circuit of the capacity variable portion is not shown and is drawn as a single box.

Referring to FIG. 4(A), in this embodiment, an impedance matching device comprises a transmission line 13 provided with an input terminal 13*a* and an output terminal 13*b*, and the variable reactance circuit 1 provided in the transmission line 13.

The first line 2 of the loosely coupled line portion 4 of the variable reactance circuit 1 is serially inserted into the transmission line 13.

According to this embodiment, based on the effects achieved by the variable reactance circuit 1, high-speed impedance matching can be achieved and an impedance matching device can be made more compact.

Referring to FIG. 4(B), in this embodiment, an impedance matching device comprises the transmission line 13 provided with the input terminal 13*a* and the output terminal 13*b*, a branch line 14 branching from the transmission line 13 and connected to ground 5, and the variable reactance circuit 1.

Furthermore, the first line 2 of the loosely coupled line portion 4 of the variable reactance circuit 1 is serially inserted into the branch line 14.

Effects similar to those obtained in the embodiment shown in FIG. 4(A) can be obtained in this embodiment.

Referring to FIG. 4(C), in this embodiment, an impedance matching device comprises the transmission line 13 provided with the input terminal 13*a* and the output terminal 13*b*, and a first variable reactance circuit 1*a* provided in the transmission line 13. The first line 2 of the loosely coupled line portion 4 of the first variable reactance circuit 1*a* is serially inserted into the transmission line 13.

The impedance matching device further comprises the branch line 14 branching from between the first variable reactance circuit 1*a* and the input terminal 13*a* in the transmission line 13 and connected to ground 5, and a second variable reactance circuit 1*b* provided in the branch line 14. The first line 2 of the loosely coupled line portion 4 of the second variable reactance circuit 1*b* is serially inserted into the branch line 14.

Effects similar to those obtained in the embodiment shown in FIG. 4(A) can be obtained in this embodiment.

Referring to FIG. 5(A), in this embodiment, an impedance matching device comprises the transmission line 13 provided with the input terminal 13*a* and the output terminal 13*b*, and the first variable reactance circuit 1*a* provided in the transmission line 13. The first line 2 of the loosely coupled line portion 4 of the first variable reactance circuit 1*a* is serially inserted into the transmission line 13.

The impedance matching device further comprises the branch line 14 branching from between the output terminal 13*b* and the first variable reactance circuit 1*a* in the transmission line 13 and connected to ground 5, and a second variable reactance circuit 1*b* provided in the branch line 14. The first line 2 of the loosely coupled line portion 4 of the second variable reactance circuit 1*b* is serially inserted into the branch line 14.

Effects similar to those obtained in the embodiment shown in FIG. 4(C) can be obtained in this embodiment.

Referring to FIG. 5(B), in this embodiment, an impedance matching device comprises the transmission line 13 provided with the input terminal 13*a* and the output terminal 13*b*, and the first variable reactance circuit 1*a* provided in the transmission line 13. The first line 2 of the loosely coupled line portion 4 of the first variable reactance circuit 1*a* is serially inserted into the transmission line 13.

The impedance matching device further comprises the second variable reactance circuit 1*b* provided between the output terminal 13*b* and the first variable reactance circuit 1*a* in the transmission line 13. The first line 2 of the loosely coupled line portion 4 of the second variable reactance circuit 1*b* is serially inserted into the transmission line 13.

The impedance matching device further comprises a coil 15 connected between ground 5 and a connection point between the first and second variable reactance circuits 1*a* and 1*b*.

Referring to FIG. 5(C), in this embodiment, an impedance matching device comprises the transmission line 13 provided with the input terminal 13*a* and the output terminal 13*b*, a first branch line 14*a* branching from the transmission line 13 and connected to ground 5, and the first variable reactance circuit 1*a* provided in the first branch line 14*a*. The first line 2 of the loosely coupled line portion 4 of the first variable reactance circuit 1*a* is serially inserted into the first branch line 14*a*.

The impedance matching device further comprises a second branch line 14*b* branching from between the output terminal 13*a* and the first variable reactance circuit 1*a* in the transmission line 13 and connected to ground 5, the coil 15 serially inserted between the first variable reactance circuit 1*a* and the second branch line 14*b*, and the second variable reactance circuit 1*b* provided in the second branch line 14*b*. The first line 2 of the loosely coupled line portion 4 of the second variable reactance circuit 1*b* is serially inserted into the second branch line 14*b*.

Although the present invention has been explained based on preferred embodiments thereof, the present invention is not limited to those embodiments and one skilled in the art can easily devise various modified embodiments within the scope of the claims of the present application.

DESCRIPTION OF REFERENCE NUMERALS

1, 1' Variable reactance circuit
1*a* First variable reactance circuit
1*b* Second variable reactance circuit
2 First line
3 Second line
3*a* One end
3*b* The other end
4 Loosely coupled line portion
5 Ground
6, 6' Capacity variable portion
7 Diode
8 Capacitor
9 Connection point
10 Resistor
11 Variable DC power supply
12 Connection point
13 Transmission line
13*a* Input terminal
13*b* Output terminal
14 Branch line
14*a* First branch line
14*b* Second branch line
15 Coil
20, 20' Variable reactance circuit
21, 21' First line
21*a*, 21*b* First line element
22, 22' Second line
22*a*, 22*b* Second line element
23, 23' Loosely coupled line portion
30, 30' Variable reactance circuit
31 First line

31*a*-31*c* First line element
32 Loosely coupled line portion
33 Second line
33*a*-33*c* Second line element
34 Loosely coupled line portion

The invention claimed is:

1. A variable reactance circuit comprising:
a loosely coupled line portion which includes a first line and a second line loosely coupled to the first line,
the second line including one end and an other end, and the second line is connected to ground at the one end; and
a capacity variable portion provided between the second line of the loosely coupled line portion and ground, wherein
the second line is coupled to the first line with a coupling constant within the range of 0.5 to 0.95.

2. The variable reactance circuit according to claim 1, wherein the first line of the loosely coupled line portion comprises a plurality of first line elements which are connected in series, and the second line of the loosely coupled line portion comprises a plurality of second line elements which are connected in parallel, and the second line elements are arranged opposite the first line elements, respectively.

3. The variable reactance circuit according to claim 1, wherein the first line of the loosely coupled line portion comprises a plurality of first line elements which are connected in parallel, and the second line of the loosely coupled line portion comprises a plurality of second line elements which are connected in series, and the second line elements are arranged opposite the first line elements, respectively.

4. The variable reactance circuit according to claim 1, wherein the second line of the loosely coupled line portion comprises a plurality of second line elements which are connected in series and arranged opposite the first line.

5. The variable reactance circuit according to claim 1, wherein the first line of the loosely coupled line portion comprises a plurality of first line elements which are connected in series and arranged opposite the second line.

6. The variable reactance circuit according to claim 1, wherein the capacity variable portion comprises
a diode connected between the other end of the second line of the loosely coupled line portion and ground,
a capacitor connected in series to the diode between the other end of the second line and the diode,
a variable DC power supply connected between ground and a connection point between the capacitor and the diode so as to apply reverse bias voltage to the diode, and
a resistor or a coil connected in series to the variable DC power supply between the connection point and ground.

7. The variable reactance circuit according to claim 1, wherein the capacity variable portion comprises
a diode connected between the other end of the second line of the loosely coupled line portion and ground,
a capacitor connected between the one end of the second line and ground,
a variable DC power supply connected between ground and a connection point between the one end of the second line and the capacitor so as to apply reverse bias voltage to the diode, and
a resistor or a coil connected in series to the variable DC power supply between the connection point and ground.

8. An impedance matching device comprising:

a transmission line provided with an input terminal and an output terminal; and the variable reactance circuit according to claim 1, the variable reactance circuit being provided in the transmission line, the first line of the loosely coupled line portion of the variable reactance circuit being serially inserted into the transmission line.

9. The impedance matching device according to claim 8, further comprising:

a branch line branching from between the variable reactance circuit and the input terminal or the output terminal in the transmission line and connected to ground; and another said variable reactance circuit provided in the branch line, the first line of the loosely coupled line portion of said another variable reactance circuit being serially inserted into the branch line.

10. The impedance matching device according to claim 8, further comprising:

another said variable reactance circuit provided between the variable reactance circuit and the input terminal or the output terminal in the transmission line, the first line of the loosely coupled line portion of said another variable reactance circuit being serially inserted into the transmission line; and a coil connected between ground and a connection point between the variable reactance circuits.

11. An impedance matching device comprising:

a transmission line provided with an input terminal and an output terminal;

a branch line branching from the transmission line and connected to ground; and the variable reactance circuit according to claim 1, the first line of the loosely coupled line portion of the variable reactance circuit being serially inserted into the branch line.

12. The impedance matching device according to claim 11, further comprising:

another branch line branching between the branch line and the input terminal or the output terminal in the transmission line and connected to ground;

a coil inserted in series between the branch lines in the transmission line; and another said variable reactance circuit provided in said another branch line, the first line of the loosely coupled line portion of said another variable reactance circuit being serially inserted into said another branch line.

* * * * *